United States Patent
Sakashita et al.

(10) Patent No.: US 11,048,836 B2
(45) Date of Patent: Jun. 29, 2021

(54) METHOD FOR PRODUCING POROUS BODY

(71) Applicant: NGK Insulators, Ltd., Nagoya (JP)

(72) Inventors: Satoshi Sakashita, Yokkaichi (JP); Hiroyuki Nagaoka, Kakamigahara (JP); Takehide Shimoda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 400 days.

(21) Appl. No.: 15/983,478

(22) Filed: May 18, 2018

(65) Prior Publication Data

US 2018/0268094 A1    Sep. 20, 2018

Related U.S. Application Data

(63) Continuation of application No. 14/663,537, filed on Mar. 20, 2015, now abandoned.

(30) Foreign Application Priority Data

Mar. 31, 2014 (JP) ................................. 2014-072362

(51) Int. Cl.
  *C04B 35/195* (2006.01)
  *C04B 38/00* (2006.01)
  (Continued)

(52) U.S. Cl.
  CPC ......... *G06F 30/20* (2020.01); *B01D 46/2451* (2013.01); *B28B 11/243* (2013.01);
  (Continued)

(58) Field of Classification Search
  CPC .............................................. C04B 2235/349
  See application file for complete search history.

(56) References Cited

U.S. PATENT DOCUMENTS

3,950,175 A * 4/1976 Lachman ................. B01J 21/14
                                                    501/80
7,704,296 B2 * 4/2010 Merkel ................. C04B 35/195
                                                    55/523
(Continued)

FOREIGN PATENT DOCUMENTS

EP    2 364 765 A1    9/2011
EP    2 832 417 A1    2/2015
(Continued)

OTHER PUBLICATIONS

U.S. Appl. No. 14/663,524, filed Mar. 20, 2015, Sakashita, et al.
(Continued)

*Primary Examiner* — Alison L Hindenlang
*Assistant Examiner* — Andrés E. Behrens, Jr.
(74) *Attorney, Agent, or Firm* — Burr & Brown, PLLC

(57) ABSTRACT

A method for producing a porous body, comprising a raw-material mixing step of mixing talc having an average particle size of 1 μm or more and 18 μm or less, alumina, an auxiliary raw material containing a material that undergoes a eutectic reaction with talc and being prepared in an amount so as to satisfy a weight ratio of 0.5% or more and 1.5% or less by weight relative to the talc, and a pore-forming agent, to provide green body, and a molding and firing step of molding the green body to provide a compact and firing this compact at a firing temperature of 1350° C. to 1440° C.

3 Claims, 10 Drawing Sheets

(51) Int. Cl.
  *B28B 5/00* (2006.01)
  *B28B 11/24* (2006.01)
  *G06F 30/20* (2020.01)
  *C04B 35/636* (2006.01)
  *B01D 46/24* (2006.01)
  *C04B 28/24* (2006.01)
  *C04B 111/00* (2006.01)

(52) U.S. Cl.
  CPC ............ *C04B 28/24* (2013.01); *C04B 35/195* (2013.01); *C04B 35/6365* (2013.01); *C04B 38/0006* (2013.01); *B01D 2046/2496* (2013.01); *C04B 2111/0081* (2013.01); *C04B 2111/00793* (2013.01); *C04B 2235/3217* (2013.01); *C04B 2235/3225* (2013.01); *C04B 2235/3229* (2013.01); *C04B 2235/3244* (2013.01); *C04B 2235/349* (2013.01); *C04B 2235/5436* (2013.01); *C04B 2235/606* (2013.01); *C04B 2235/6021* (2013.01)

(56) References Cited

U.S. PATENT DOCUMENTS

| | | | |
|---|---|---|---|
| 8,747,511 B2* | 6/2014 | Motoki | C04B 35/195 422/169 |
| 2007/0119133 A1* | 5/2007 | Beall | B01D 39/2068 55/523 |
| 2009/0137382 A1 | 5/2009 | Merkel | |
| 2009/0220736 A1 | 9/2009 | Merkel | |
| 2010/0126132 A1 | 5/2010 | Merkel | |
| 2010/0135866 A1 | 6/2010 | Mizuno | |
| 2011/0252773 A1* | 10/2011 | Arnold | F01N 13/009 60/297 |

FOREIGN PATENT DOCUMENTS

| | | |
|---|---|---|
| JP | 2009-517327 A | 4/2009 |
| JP | 2011-504869 A | 2/2011 |
| JP | 2013-530332 A | 7/2013 |
| WO | 2013/146499 A1 | 10/2013 |

OTHER PUBLICATIONS

Partial European Search Report (Application No. 15160214.1) dated Sep. 10, 2015.
Extended European Search Report (Application No. 15160214.1) dated Jan. 13, 2016.
Japanese Office Action, Japanese Application No. 2014-072362, dated Aug. 29, 2017 (6 pages).
Extended European Search Report (Application No. 18185316.9) dated Sep. 25, 2018.
European Office Action (Application No. 18 185 316.9) dated Jun. 26, 2019.

* cited by examiner

METHOD FOR PRODUCING POROUS BODY

CROSS-REFERENCE TO RELATED APPLICATIONS

This application is a Continuation of U.S. application Ser. No. 14/663,537, filed Mar. 20, 2015, the entirety of which is incorporated herein by reference, and claims the benefit under 35 U.S.C § 119(a)-(d) of Japanese Patent Application No. 2014-072362, filed Mar. 31, 2014.

BACKGROUND OF THE INVENTION

1. Field of the Invention

The present invention relates to a porous body, a honeycomb filter, and a method for producing a porous body.

2. Description of the Related Art

It is known that porous bodies are employed in exhaust-gas cleaning structures such as honeycomb filters. For example, Patent Literature 1 describes a method for producing a porous body in which a base material composed of an inorganic material and a pore-forming agent are mixed to provide green body; the green body is shaped into a compact; and the compact is fired at a predetermined firing temperature. According to this method for producing a porous body, a porous body having a high trapping capability can be produced by setting the base material and the pore-forming agent so as to satisfy a predetermined range of (D90−D10)/D50 where D10 represents the particle size at 10 vol %, D50 represents the particle size at 50 vol %, and D90 represents the particle size at 90 vol %.

CITATION LIST

Patent Literature

[PTL 1] International Publication No. 2013/146499

SUMMARY OF INVENTION

The higher capability of trapping particulate matter (PM) in exhaust gas porous bodies have, the more preferable they are. Thus, there has been a demand for a porous body having a higher trapping capability.

The present invention has been made in order to meet such a demand. A main object of the present invention is to provide a porous body and a honeycomb filter that have a higher trapping capability.

A porous body of the present invention has a flow-rate-weighted mean diameter Ru of 10 μm or more and 24 μm or less, wherein the flow-rate-weighted mean diameter Ru is obtained as follows:

based on an image obtained by three-dimensionally scanning the porous body, porous body data is created in which positional information indicating position of a voxel in the image is associated with voxel-type information indicating whether the voxel is space voxel representing space or matter voxel representing object;

a process is carried out in which a single parent virtual sphere is placed in the porous-body data so as to have as large a diameter as possible so that the parent virtual sphere fills space voxels without overlapping the matter voxel, at least one child virtual sphere whose center overlaps the parent virtual sphere that has been placed is placed such that voxels occupied by the at least one child virtual sphere do not overlap the matter voxel and fill space voxels, and a single virtual curved surface solid made up of the parent virtual sphere and the at least one child virtual sphere is placed such that curved surface solid voxels, which are voxels occupied by the virtual curved surface solid, fill space voxels; this process is repeated to place a plurality of the virtual curved surface solids such that voxels occupied by different virtual curved surface solids do not overlap each other;

based on the porous-body data, fluid analysis is carried out by the lattice Boltzmann method in terms of a fluid flowing through a predetermined inflow plane into the porous body, to obtain flow-rate vectors of the fluid in individual space voxels during passing of the fluid through the porous body; and based on information regarding the virtual curved surface solids that have been placed and information regarding the flow-rate vectors in individual space voxels, the flow-rate-weighted mean diameter Ru is obtained by an expression (1) below

[Math. 1]

$$Ru = \frac{\sum_{i=1}^{n}(R'_i \times V_i \times U_i)}{\sum_{i=1}^{n}(V_i \times U_i)} \quad (1)$$

where

Ru: flow-rate-weighted mean diameter [μm]

n: number of virtual curved surface solids that have been placed [number]

$R'_i$: equivalent diameter of each virtual curved surface solid [μm] (i=1, . . . , n)

$V_i$: volume of each virtual curved surface solid [cc] (i=1, 2, . . . , n)

$U_i$: average flow rate of fluid passing through each virtual curved surface solid [mm/s] (i=1, 2, . . . , n).

The inventors of the present invention have found that a filter including a porous body having a flow-rate-weighted mean diameter that is not excessively large or small tends to have a high trapping capability. The inventors have found that a flow-rate-weighted mean diameter Ru of 10 μm or more and 24 μm or less results in a sufficiently high trapping capability. A porous body according to the present invention satisfies this condition and hence achieves a sufficiently high trapping capability. This is probably achieved for the following reason. The larger the extent of variation in volume or average flow rate among a plurality of virtual curved surface solids that have been placed, the larger the tendency for the flow-rate-weighted mean diameter Ru to become excessively large or small. Regarding pores of a porous body that are simulated with virtual curved surface solids having a large volume, the probability that a fluid passing through the pores comes into contact with the wall surfaces of the porous body tends to decrease. Regarding pores of a porous body that are simulated with virtual curved surface solids having a small volume, a fluid tends not to pass through the pores or a catalyst tends not to be appropriately applied to the wall surfaces of the pores, the catalyst being used for the porous body to be used as a filter. Regarding pores of a porous body that are simulated with virtual curved surface solids having an average flow rate higher than the average flow rate (simple average flow rate) of the whole pores of the porous body, a fluid passes through these pores in a short time and hence these pores tend not to contribute to the trapping capability. Regarding pores of a porous body that are simulated with virtual curved surface solids having an average flow rate lower than the average flow rate (simple average flow rate) of the whole pores of the porous body, the amount of a fluid entering these pores is small and hence these pores tend not to contribute to the trapping capability. As has been described, pores of a porous body that are simulated with virtual curved surface solids having an excessively large or small volume or an excessively high or low average flow rate tend not to contribute to the trapping capability. This is probably the reason why, in porous bodies having a large portion that tends not to contribute to the trapping capability, the flow-rate-weighted mean diameter Ru is found to be excessively large or small; and a flow-rate-weighted mean diameter Ru of 10 μm or more and 24 μm or less results in a sufficiently high trapping capability.

In such a case where a plurality of child virtual spheres are placed for placing a single virtual curved surface solid, the plurality of child virtual spheres are allowed to overlap each other. The fluid analysis is carried out in terms of a fluid flowing from a predetermined inflow plane to a predetermined outflow plane of the porous body.

In a porous body according to the present invention, based on the information regarding the virtual curved surface solids that have been placed, an arithmetic mean diameter Rc=(R'$_1$+R'$_2$+ . . . +R'$_n$)/n is obtained, and a difference ΔR (=|Ru−Rc|) is preferably 2 μm or less. When the difference ΔR satisfies this range, a higher trapping capability tends to be achieved.

A honeycomb filter according to the present invention includes
a partition that include the porous body according to any one of the above-described embodiments of the present invention and form a plurality of cells of which one end is open and the other end is sealed and serving as a fluid channel.

In this honeycomb filter, since the porous body forming the partitions satisfies, for example, the above-described range of the flow-rate-weighted mean diameter Ru, a sufficiently high trapping capability is achieved during passing of a fluid through the honeycomb filter.

A method for producing a porous body of the present invention includes:
a raw-material mixing step of mixing talc having an average particle size of 1 μm or more and 18 μm or less, alumina, an auxiliary raw material containing a material that undergoes a eutectic reaction with talc and being prepared in an amount so as to satisfy a weight ratio of 0.5% or more and 1.5% or less by weight relative to the talc, and a pore-forming agent, to provide green body; and
a molding and firing step of molding the green body to provide a compact and firing this compact at a firing temperature of 1350° C. to 1440° C.

The inventors of the present invention have found that production of a porous body by the above-described production method including the steps provides a porous body having a higher trapping capability. The reason for this is probably as follows. Use of talc having an average particle size of 18 μm or less probably results in suppression of generation of excessively large pores. By adding an auxiliary raw material containing a material that undergoes a eutectic reaction with talc, excessively small pores through which a fluid tends not to pass are probably filled. In addition, the firing temperature of 1350° C. to 1440° C. probably results in a sufficiently high strength of the porous body. As a result, generation of excessively large or small pores is suppressed and generation of pores causing an excessively high or low flow rate is suppressed; and this probably results in a high trapping capability. Note that the production method allows production of the above-described porous body according to the present invention, which has a flow-rate-weighted mean diameter Ru of 10 μm or more and 24 μm or less.

In a method for producing a porous body according to the present invention, the talc may have an average particle size of 5 μm or more and 12 μm or less. The talc having an average particle size of 12 μm or less suppresses more effectively the above-described generation of excessively large pores.

In a method for producing a porous body according to the present invention, the weight ratio of the auxiliary raw material relative to the talc is preferably 0.5% or more and 1.0% or less by weight. The auxiliary raw material may be at least one selected from zirconium oxide, cerium oxide, and yttrium oxide. In addition, the firing temperature is preferably 1410° C. to 1430° C.

DESCRIPTION OF THE PREFERRED EMBODIMENTS

Figure 1:
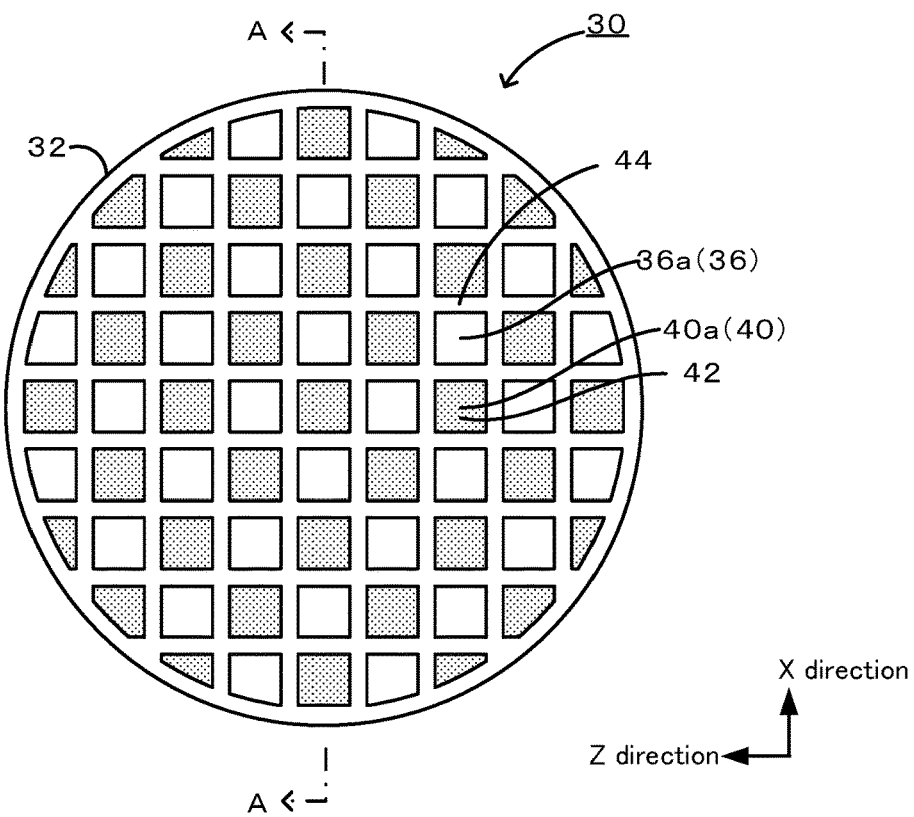
FIG. 1 is a front view of a honeycomb filter 30 including porous partitions 44.
Figure 2:
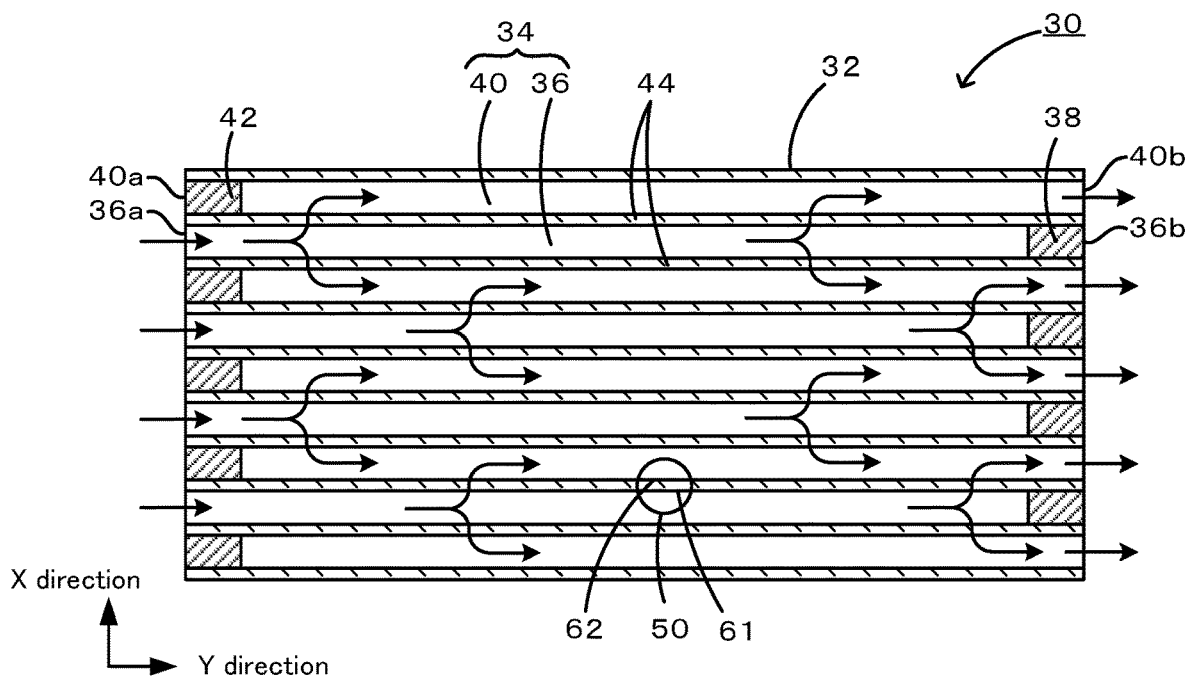
FIG. 2 is a sectional view taken along line A-A in FIG. 1.

Hereinafter, embodiments for carrying out the present invention will be described with reference to the drawings. FIG. 1 is a front view of a honeycomb filter 30 including porous partitions 44 formed of a porous body according to an embodiment of the present invention. FIG. 2 is a sectional view taken along line A-A in FIG. 1. The honeycomb filter 30 is a diesel particulate filter (DPF) having a function of filtering off particulate matter (PM) in exhaust gas emitted from a diesel engine. The honeycomb filter 30 includes a large number of cells 34 (refer to FIG. 2) defined by the porous partitions 44. A peripheral protective part 32 is formed around the cells 34. The material of the porous partitions 44 is preferably a ceramic material formed of inorganic particles of Si—SiC, cordierite, or the like from the standpoint of strength and heat resistance. The porous partitions 44 preferably have a thickness of 200 μm or more and less than 600 μm. This thickness is 300 μm in this embodiment. The porous partitions 44 have an average pore size (measured by mercury porosimetry) of 10 μm or more and less than 60 μm and a porosity (void ratio) of 40% or more and less than 65%, for example. As illustrated in FIG. 2, a large number of cells 34 formed in the honeycomb filter 30 are divided into open-inlet cells 36 having an open inlet 36$a$ and an outlet 36$b$ sealed with an outlet sealing material 38, and open-outlet cells 40 having an inlet 40$a$ sealed with an inlet sealing material 42 and an open outlet 40$b$. Such open-inlet cells 36 and open-outlet cells 40 are alternately disposed so as to be adjacent to one another. The density of the cells is 15 cells/cm$^2$ or more and less than 65 cells/cm$^2$, for example. The peripheral protective part 32 is a layer for protecting the periphery of the honeycomb filter 30. The peripheral protective part 32 may contain, for example, the above-described inorganic particles, inorganic fibers of aluminosilicate, alumina, silica, zirconia, ceria, mullite, or the like, and a binder such as colloidal silica or clay.

The honeycomb filter 30 is placed downstream of a diesel engine (not shown) and used to clean PM-containing exhaust gas to be released into the air, for example. Arrows in FIG. 2 indicate flows of exhaust gas in this occasion. The exhaust gas containing PM emitted from the diesel engine flows through the inlets 36$a$ of the honeycomb filter 30 into the open-inlet cells 36, then passes through the porous partitions 44 into the adjacent open-outlet cells 40, and is released through the outlets 40$b$ of the open-outlet cells 40 into the air. While the exhaust gas containing PM flows from the open-inlet cells 36 through the porous partitions 44 into the open-outlet cells 40, PM is trapped; and hence the exhaust gas having flowed into the open-outlet cells 40 is a clean exhaust gas not containing PM. The interior of the pores of the porous partitions 44 is coated with an oxidation catalyst such as platinum (not shown). The oxidation catalyst oxidizes trapped PM to thereby suppress a decrease in the porosity of the porous partitions 44 or a sharp increase in pressure loss.

The porous partitions 44 of this embodiment subjected to an analysis (described below) of the microstructure of the porous body forming the porous partitions 44, are found to have a flow-rate-weighted mean diameter Ru of 10 μm or more and 24 μm or less. It is more preferable that a difference ΔR is 2 μm or less. Hereinafter, the method of analyzing the microstructure will be described.

Figure 3:
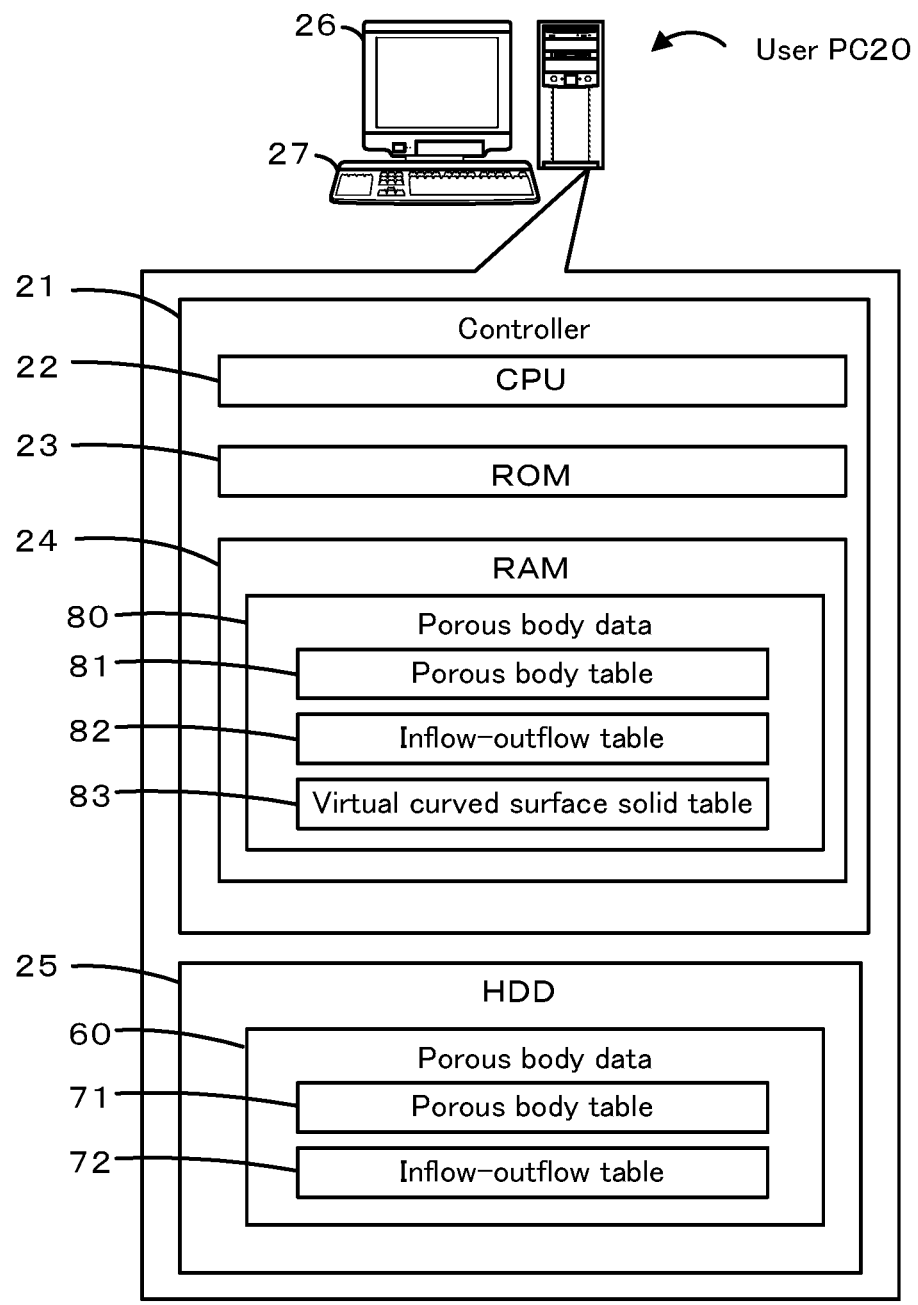
FIG. 3 illustrates the configuration of a user personal computer 20 serving as a microstructure analyzer.

FIG. 3 schematically illustrates the configuration of a user personal computer (PC) 20 designed as a microstructure analyzer for analyzing the microstructure of the porous partitions 44. The user PC 20 includes a controller 21 that includes, for example, a CPU 22 that executes various processes, a ROM 23 that stores various processing programs or the like, and a RAM 24 that temporarily stores data; a HDD 25 that is a mass storage memory storing various processing programs such as analysis processing programs and various data such as porous-body data 60 that is three-dimensional voxel data of a porous body. The user PC 20 is equipped with a display 26 that displays various information on the screen and input devices 27 with which the user input various commands, such as a keyboard. As will be described in detail below, the porous-body data 60 stored in the HDD 25 includes a porous-body table 71 and an inflow-outflow table 72. The user PC 20 functions to analyze the microstructure of a porous body on the basis of the porous-body data 60 stored in the HDD 25. During this analysis of the microstructure, porous-body data 80 is stored in the RAM 24. As will be described in detail below, the porous-body data 80 includes a porous-body table 81, an inflow-outflow table 82, and a virtual-curved-surface solid-table 83.

The HDD 25 of the user PC 20 stores, as the porous-body data 60, the three-dimensional voxel data of the porous partitions 44 obtained by subjecting the honeycomb filter 30 to a CT scan. In this embodiment, an XY plane defined by the X direction and the Y direction illustrated in FIG. 2 is selected as an imaging section; and a plurality of such imaging sections are produced in the Z direction illustrated in FIG. 1. In this way, the CT scan is carried out to obtain voxel data. In this embodiment, the resolution in each of the X, Y, and Z directions is 1.2 μm, which provides a cube having 1.2 μm sides and serving as the minimum unit of three-dimensional voxel data, that is, a voxel. The resolution in each of the X, Y, and Z directions can be appropriately set in accordance with, for example, the performance of the CT scanner or the size of particles to be analyzed. The resolutions in the directions may be set to be different from each other. The resolutions in the X, Y, and Z directions may be, but not limited to, set to values within a range of 0.5 to 3.0 μm, for example. Each voxel is identified in terms of its position by X, Y, and Z coordinates (a coordinate value of 1 corresponds to a length of a side of a voxel, 1.2 μm). The coordinates are associated with type information indicating whether the voxel represents a space (pore) or an object (material of the porous partitions 44) and stored in the HDD 25. In this embodiment, voxels representing spaces (space voxels) are tagged with a type-information value of 0; and voxels representing objects (matter voxels) are tagged with a type-information value of 9. Actually, the data obtained by a CT scan is luminance data at individual X, Y, and Z coordinates, for example. The porous-body data 60 used in this embodiment can be obtained by converting this luminance data into a binary representation with respect to a predetermined threshold so that voxels are determined as to whether each voxel at coordinates is a space voxel or a matter voxel. The predetermined threshold is set as a value that allows appropriate determination as to whether the voxels are space voxels or matter voxels. This threshold may be empirically set in advance such that the measured porosity of the porous partitions 44 is substantially equal to the porosity of the binarized voxel data, for example. Such CT scans can be carried out with SMX-160CT-SV3 manufactured by SHIMADZU CORPORATION, for example.

Figure 4A:
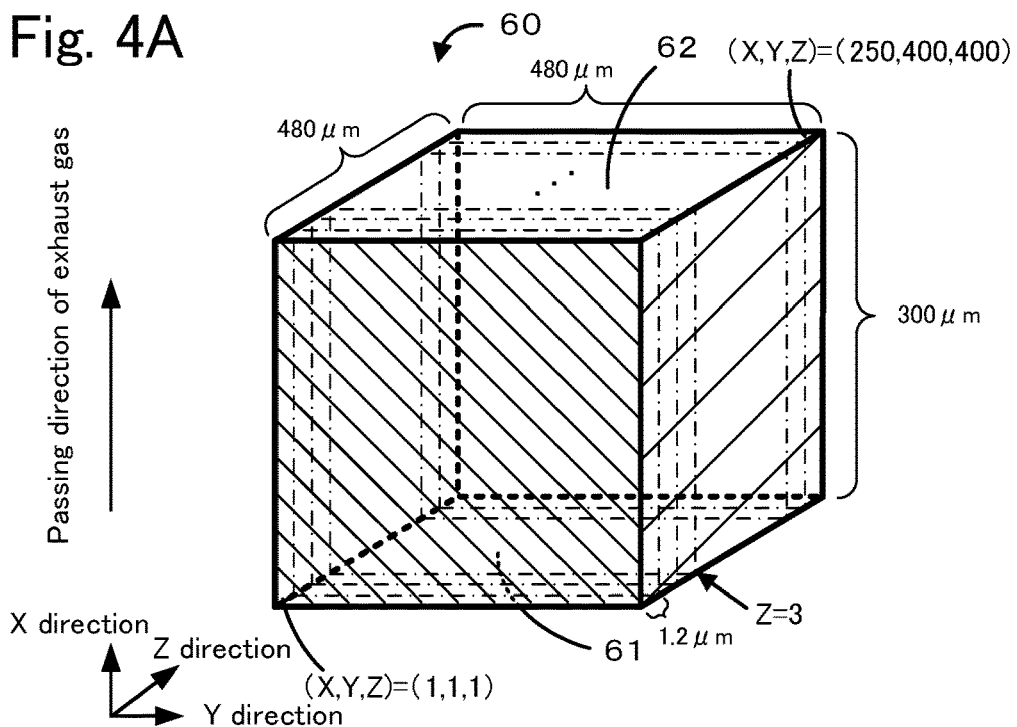
FIGS. 4A and 4B illustrate conceptual views of porous-body data 60.
Figure 4B:
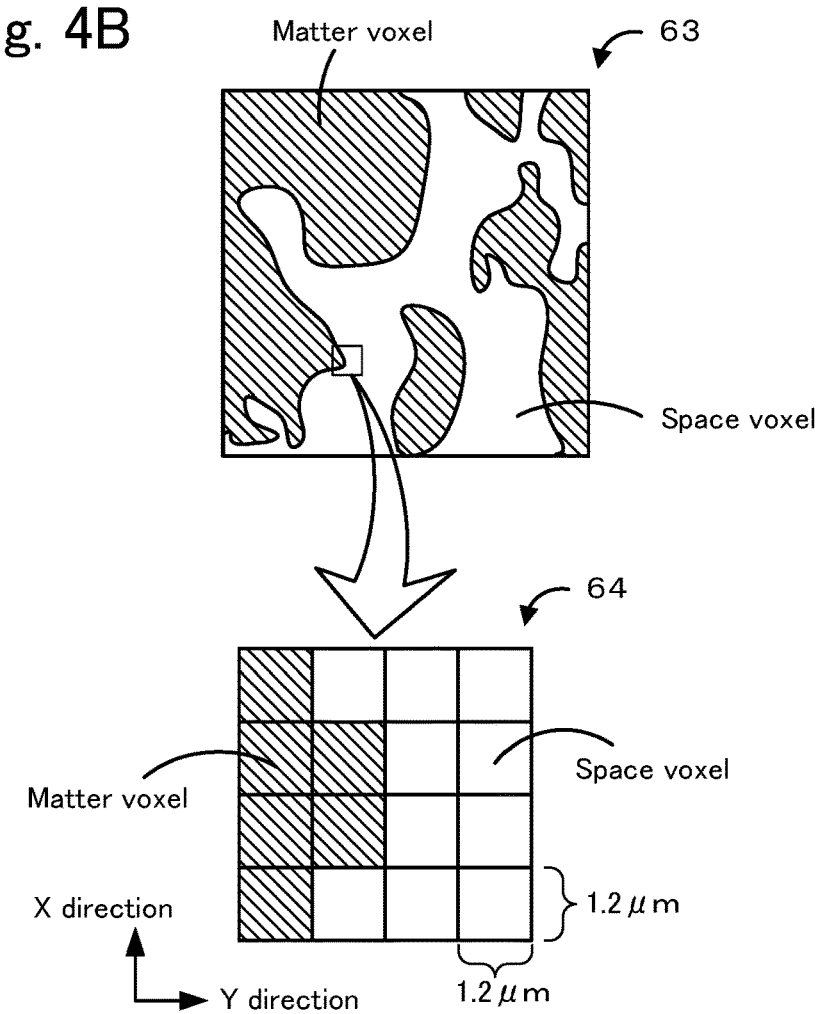
Figure 5:
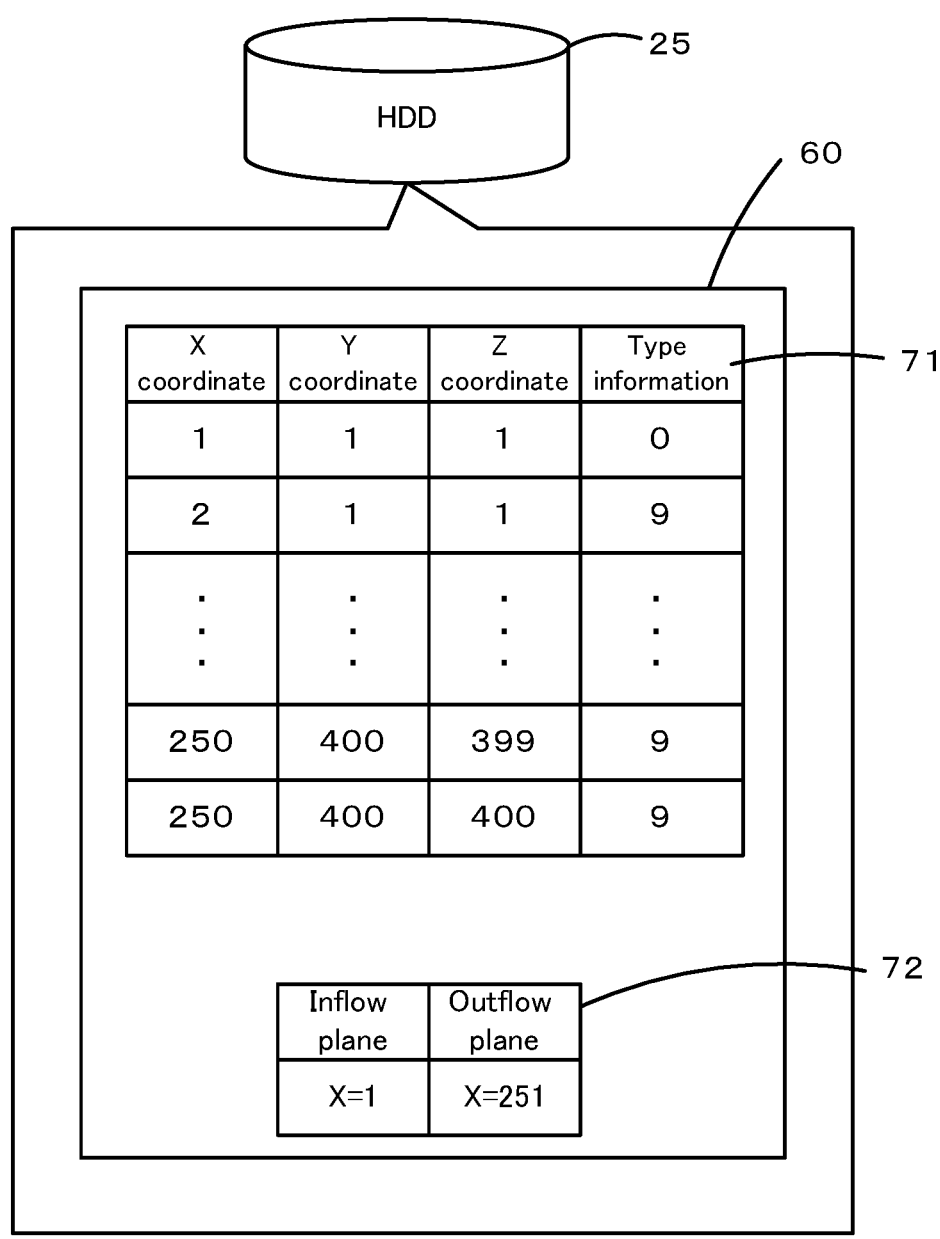
FIG. 5 is an explanatory view of porous-body data 60.

FIGS. 4A and 4B illustrate conceptual views of the porous-body data 60. FIG. 4A is a conceptual view of the porous-body data 60 obtained as voxel data by subjecting, to a CT scan, the porous partition 44 in a region 50 in FIG. 2. This porous-body data 60 in this embodiment is extracted from the voxel data of the porous partition 44. The porous-body data 60 is voxel data of a rectangular parallelepiped portion having a length of 300 μm (=1.2 μm×250 voxels) in the X direction, which is the same as the thickness of the porous partition 44 in the passing direction of exhaust gas, having a length of 480 μm (=1.2 μm×400 voxels) in the Y direction, and having a length of 480 μm (=1.2 μm×400 voxels) in the Z direction. This porous-body data 60 is subjected to the analysis processing described below. Note that the dimensions of the porous-body data 60 can be appropriately set in accordance with, for example, the thickness or size of the porous partition 44 or an acceptable calculation load. For example, the length in the X direction is not limited to 300 μm and may be another value that is the same as the thickness of the porous partition 44 in the passing direction of exhaust gas. The length in the X direction is preferably the same value as the thickness of the porous partition 44 in the passing direction of exhaust gas; however, the length and the thickness may be different values. The lengths in the Y and Z directions are also not limited to 480 μm and may be other values. The lengths in the Y and Z directions may be different from each other. Among the six planes of the rectangular parallelepiped of the porous-body data 60, two planes (planes parallel to the Y-Z plane) are an inflow plane 61 (refer to FIG. 2) that is a boundary surface between the porous partition 44 and the open-inlet cell 36, and an outflow plane 62 (refer to FIG. 2) that is a boundary surface between the porous partition 44 and the open-outlet cell 40 in the region 50; and the other four planes are sections of the porous partition 44. FIG. 4B illustrates an XY plane (imaging section) 63 at a position where the Z coordinate is 3 in the porous-body data 60 and an enlarged view 64 of a portion of the XY plane 63. As illustrated in the enlarged view 64, the XY plane 63 is made up of arranged voxels having 1.2 μm sides. Each voxel is expressed as a space voxel or a matter voxel. Note that the imaging section obtained by a CT scan is a planar data having no thickness in the Z direction as illustrated in FIG. 4B. However, each imaging section is handled as having a thickness of the gap (1.2 μm) between imaging sections in the Z direction. In other words, each voxel is handled as a cube having 1.2 μm sides as described above. Note that, as illustrated in FIG. 5, the porous-body data 60 is stored, in the HDD 25, as data including the porous-body table 71 in which the XYZ coordinates of each voxel serving as positional information are associated with type information, and the inflow-outflow table 72 indicating the inflow plane 61 and the outflow plane 62. In FIG. 5, "X=1" in the inflow-outflow table 72 denotes the plane at X=1 of the XYZ coordinate system, that is, the inflow plane 61 illustrated in FIG. 4A. Similarly, "X=251" denotes the outflow plane 62. The HDD 25 stores, in addition to the porous-body data 60, a plurality pieces of other porous-body data representing the voxel data of the porous partitions 44 in terms of regions other than the region 50.

Figure 6:
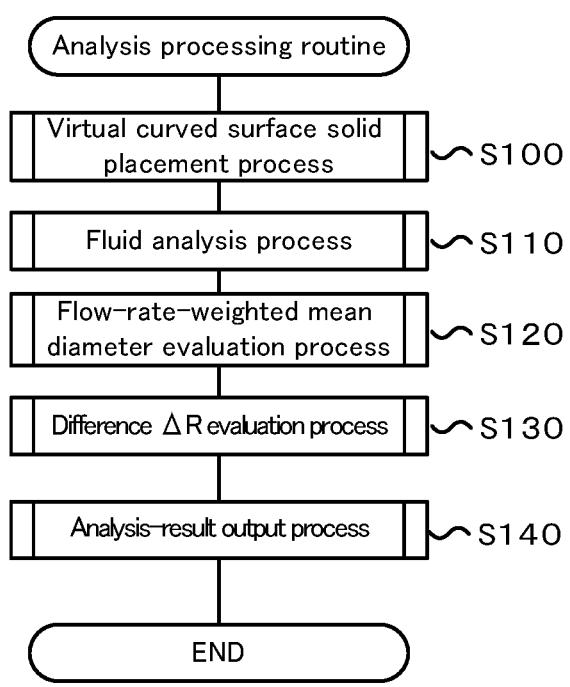
FIG. 6 is a flow chart illustrating an example of an analysis processing routine.

Hereinafter, analysis processing carried out by the user PC 20 for the porous-body data 60 will be described. FIG. 6 is a flow chart of an analysis processing routine. This analysis processing routine is carried out as follows: according to a command of carrying out analysis processing input by the user via the input devices 27, the CPU 22 executes the analysis processing programs stored in the HDD 25. Hereinafter, the case of carrying out analysis processing of the porous-body data 60 will be described; however, analysis processing of other porous-body data can be similarly carried out. The porous-body data that is to be analyzed may be set in advance or may be selected by the user.

Upon start of the analysis processing routine, the CPU 22 executes an virtual-curved-surface-solid placement process (Step S100) of placing virtual curved surface solids so as to fill space voxels of the porous-body data 60.

Figure 7:
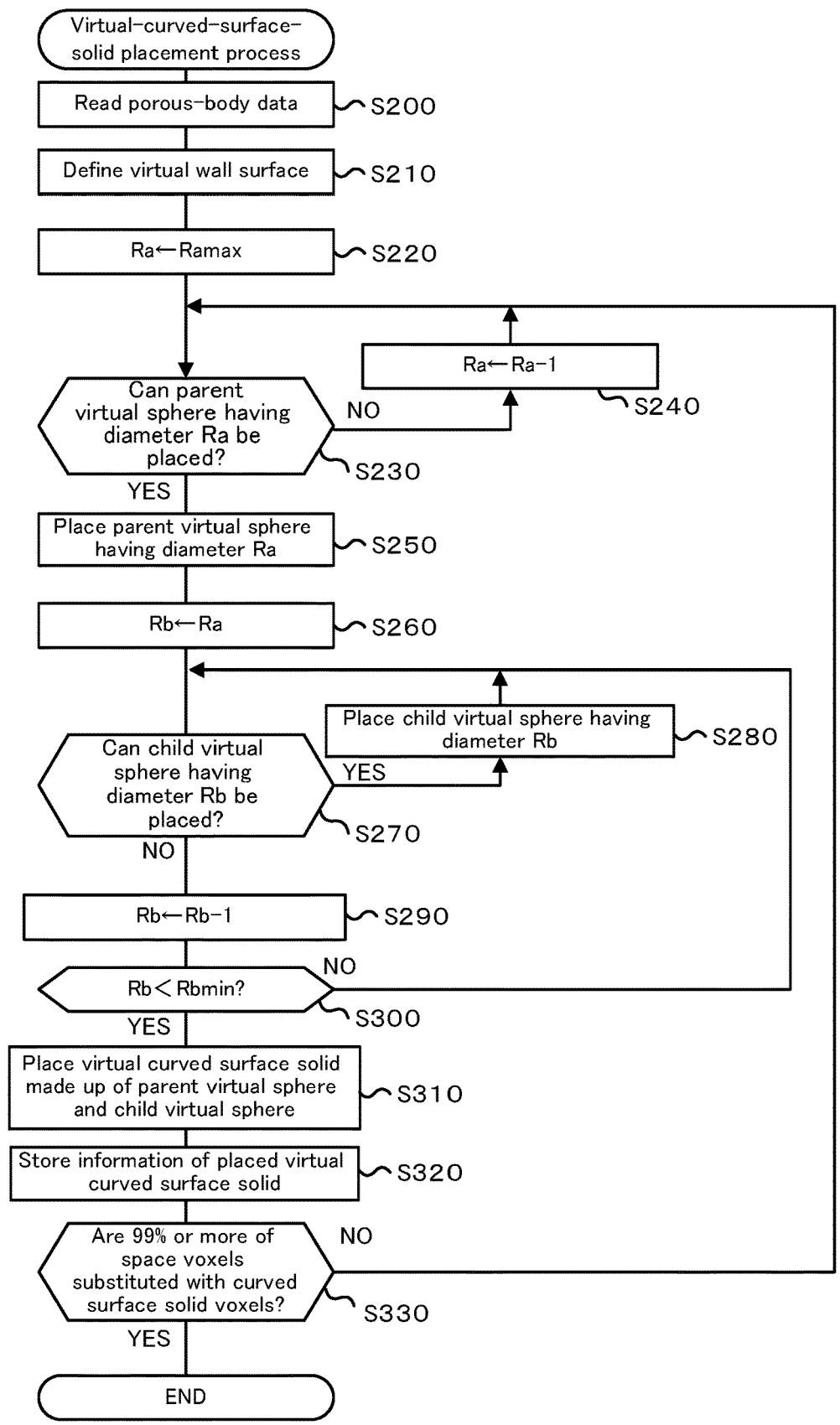
FIG. 7 is a flow chart illustrating an example of an virtual-curved-surface-solid placement process.

Here, the description of the analysis processing routine is interrupted and the virtual-curved-surface-solid placement process will be described. FIG. 7 is a flow chart of the virtual-curved-surface-solid placement process. This virtual-curved-surface-solid placement process is executed by the CPU 22. Upon execution of the virtual-curved-surface solid placement process, the CPU 22 reads the porous-body data 60 stored in the HDD 25 and stores it in the RAM 24 (Step S200). As a result, the data the same as the porous-body data 60 including the porous-body table 71 and the inflow-outflow table 72 and stored in the HDD 25 is stored in the RAM 24 as the porous-body data 80 including a porous-body table 81 and an inflow-outflow table 82. In the porous-body data 80 that have been read, virtual wall surfaces are defined (Step S210). Specifically, the user inputs via the input devices 27 the distance from the porous-body data 80 that is a 300 μm×480 μm×480 μm rectangular parallelepiped to the surrounding virtual wall surfaces; and the CPU 22 receives this input and stores it in the RAM 24. For example, in a case where the distance to the virtual wall surfaces is defined as 1 μm, the CPU 22 recognizes that the virtual wall surfaces are present 1 μm outside the planes of the porous-body data 80 in the X, Y, and Z directions, and that regions outside the virtual wall surfaces are fully occupied by matter voxels. Specifically, since the porous-body data 80 is a 300 μm×480 μm×480 μm rectangular parallelepiped, it is recognized as being covered by the virtual wall surfaces that form a 302 μm×482 μm×482 μm rectangular parallelepiped. These virtual wall surfaces are set in order to define the region within which virtual curved surface solids (parent virtual spheres and child virtual spheres) described below can be placed.

Subsequently, the CPU 22 sets the diameter Ra of a parent virtual sphere to a maximum value Ramax (Step S220) and determines as to whether or not the parent virtual sphere having the diameter Ra can be placed within space voxels inside the virtual wall surfaces defined in Step S210 (Step S230). The parent virtual sphere having the diameter Ra is a virtual sphere that has a size with a diameter of Ra (μm) and whose center is positioned at the center of one of voxels. Whether or not the parent virtual sphere having the diameter Ra can be placed is determined in the following manner, for example. One voxel is selected from space voxels (voxels having a type-information value of 0) at the time. If the parent virtual sphere that has the diameter Ra and whose center is positioned at the selected voxel is placed and the parent virtual sphere overlaps the matter voxel, another space voxel is selected again as the center. In this way, space voxels are selected one after another; and, if the parent virtual sphere at a voxel does not overlap the matter voxel, it is determined that the parent virtual sphere that has the diameter Ra can be placed at the position. If the parent virtual spheres centered at all space voxels at the time overlap the matter voxel, it is determined that the parent virtual sphere that has the diameter Ra cannot be placed. Note that the voxel serving as the center may be selected in random order; alternatively, the voxel may be selected in the order of voxels from the voxels on the inflow plane 61 to the voxels on the outflow plane 62. The maximum value Ramax is equal to or more than the maximum diameter of normal pores in the porous partition 44 and can be set with reference to a value determined in an experiment, for example. If Step S230 determines that no parent virtual sphere can be placed, the diameter Ra is decremented by 1 (Step S240) and Step S230 and processes subsequent thereto are carried out. In this embodiment, the decrement is set to 1; however, the decrement can be appropriately set in accordance with an acceptable calculation load or the like.

If Step S230 determines that a parent virtual sphere can be placed, this single parent virtual sphere having the diameter Ra is placed at the position (Step S250). Specifically, in the porous-body table 81 of the porous-body data 80 stored in the RAM 24 in Step S200, the type information of voxels occupied by the parent virtual sphere having the diameter Ra is changed to another value of 3, which indicates that the voxels are occupied by the parent virtual sphere. In this embodiment, when the centers of voxels are contained within a parent virtual sphere, the type information of the voxels is changed to another value of 3. Alternatively, when a predetermined percentage (for example, 50%) or more of the volume of voxels are occupied by a parent virtual sphere, the type information of the voxels may be changed to another value of 3; the type information of only the voxels completely contained within a parent virtual sphere may be changed to another value of 3; or when at least portions of voxels are occupied by a parent virtual sphere, the type information of the voxels may be changed to another value of 3. This is also the case for voxels occupied by child virtual spheres described below.

Subsequently, the CPU 22 sets the diameter Rb of a child virtual sphere to the same value as that of the diameter Ra (Step S260) and determines as to whether or not the child virtual sphere having the diameter Rb can be placed within space voxels inside the virtual wall surfaces defined in Step S210 (Step S270). The child virtual sphere having the diameter Rb is a virtual sphere that has a size with a diameter of Rb (μm), whose center is positioned at the center of one of voxels, and shares some occupied voxels with the parent virtual sphere. The child virtual sphere is placed such that the center of the child virtual sphere overlaps the parent virtual sphere that has been placed in Step S250. Whether or not the child virtual sphere having the diameter Rb can be placed is determined in the following manner, for example. One voxel is selected from voxels occupied by the parent virtual sphere (voxels having a type-information value of 3) at the time. If the child virtual sphere that has the diameter Rb and whose center is positioned at the selected voxel is placed and the child virtual sphere overlaps the matter voxel, another voxel occupied by the parent virtual sphere is selected as the center. In this way, the voxels are selected one after another; and, if the child virtual sphere at a voxel does not overlap the matter voxel, it is determined that the child virtual sphere that has the diameter Rb can be placed at the position. If the child virtual spheres centered at all space voxels occupied by the parent virtual sphere at the time overlap the matter voxel, it is determined that the child virtual sphere that has the diameter Rb cannot be placed.

If Step S270 determines that a child virtual sphere can be placed, this single child virtual sphere having the diameter Rb is placed at the position (Step S280). Specifically, in the porous-body table 81 of the porous-body data 80 stored in the RAM 24 in Step S200, the type information of voxels occupied by the child virtual sphere having the diameter Rb is changed to another value of 4, which indicates that the voxels are occupied by the child virtual sphere. Note that this change in type information is not carried out for voxels having a type-information value of 3, which are occupied by the parent virtual sphere. In other words, the voxels that are occupied by both the parent virtual sphere and the child virtual sphere are tagged with the type information of the parent virtual sphere. After the single child virtual sphere is placed, Step S270 and processes subsequent thereto are carried out and Step S280 is repeated to place child virtual spheres having the diameter Rb until it is determined that another child virtual sphere having the diameter Rb can be no longer placed. Note that child virtual spheres are allowed to overlap each other. In other words, voxels occupied by a child virtual sphere are allowed to overlap voxels occupied by another child virtual sphere.

If Step S270 determines that no child virtual sphere can be placed, the diameter Rb is decremented by 1 (Step S290); it is determined as to whether or not the diameter Rb is less than a minimum value Rbmin (Step S300); if the diameter Rb is equal to or more than the minimum value Rbmin, Step S270 and processes subsequent thereto are carried out. The minimum value Rbmin is the lower limit of the diameter Rb of child virtual spheres. The minimum value Rbmin is a threshold that is defined so as not to place child virtual spheres that have a relatively small diameter and do not considerably influence the analysis result, for example. In this embodiment, Rbmin is set to 2 μm.

If Step S300 determines that the diameter Rb is less than the minimum value Rbmin, a virtual curved surface solid is placed (Step S310), the virtual curved surface solid being made up of the parent virtual sphere that has been placed in Step S250 and the child virtual spheres that have been placed in Step S280. Specifically, in the porous-body table 81 of the porous-body data 80 stored in the RAM 24 in Step S200, the type information of voxels occupied by the parent virtual sphere (voxels having a type-information value of 3) and voxels occupied by the child virtual spheres (voxels having a type-information value of 4) is changed to another value of 5, which indicates that the voxels are curved surface solid voxels occupied by the virtual curved surface solid. In addition, the positional information of the curved surface solid voxels whose type information has been changed to another value of 5 this time is associated with the identification code of the virtual curved surface solid. Such identification codes of virtual curved surface solids are values individually allocated in the order that the virtual curved surface solids are placed, for example. The curved surface solid voxels of a single virtual curved surface solid are associated with the same identification code. The information regarding the virtual curved surface solid is stored in the RAM 24 (Step S320) and it is determined as to whether or not 99% or more of space voxels are substituted with the curved surface solid voxels (Step S330). Specifically, with reference to the type information of voxels in the porous-body table 81 stored in the RAM 24, this determination is carried out as to whether or not the ratio of the number of voxels having a type-information value of 5 to the total number of the voxels having a type-information value of 0 and the voxels having a type-information value of 5 is 99% or more. Note that the threshold used in this determination is not limited to 99% and another value may be employed. If the ratio of space voxels that have been substituted with curved surface solid voxels is less than 99% in Step S330, Step S230 and processes subsequent thereto are carried out to place another virtual curved surface solid. If the ratio of space voxels that have been substituted with curved surface solid voxels is 99% or more in Step S330, the virtual-curved-surface-solid placement process is finished.

Note that, during the placement of virtual curved surface solids one after another by repeating Step S230 and processes subsequent thereto, in this embodiment, voxels occupied by an virtual curved surface solid placed at a time are allowed to overlap voxels occupied by another virtual curved surface solid that has been placed. Specifically, in Step S230 in the virtual-curved-surface-solid placement process, even when a parent virtual sphere having a diameter Ra to be placed overlaps a virtual curved surface solid that has been placed, this parent virtual sphere is allowed to be placed. In other words, in Step S230, if a parent virtual sphere having a diameter Ra does not overlap the matter voxel, regardless of whether or not the parent virtual sphere overlaps virtual curved surface solids that have been placed, Step S230 determines that the parent virtual sphere having a diameter Ra can be placed at the position. Similarly, in Step S270, even when a child virtual sphere having a diameter Rb to be placed overlaps a virtual curved surface solid that has been placed, this child virtual sphere is allowed to be placed. In other words, in Step S270, if a child virtual sphere having a diameter Rb does not overlap the matter voxel, regardless of whether or not the child virtual sphere overlaps virtual curved surface solids that have been placed, Step S270 determines that the child virtual sphere having a diameter Rb can be placed at the position. As a result, compared with the cases where virtual curved surface solids are placed so as not to overlap other virtual curved surface solids, virtual curved surface solids having a relatively large volume can be placed.

Figure 8:
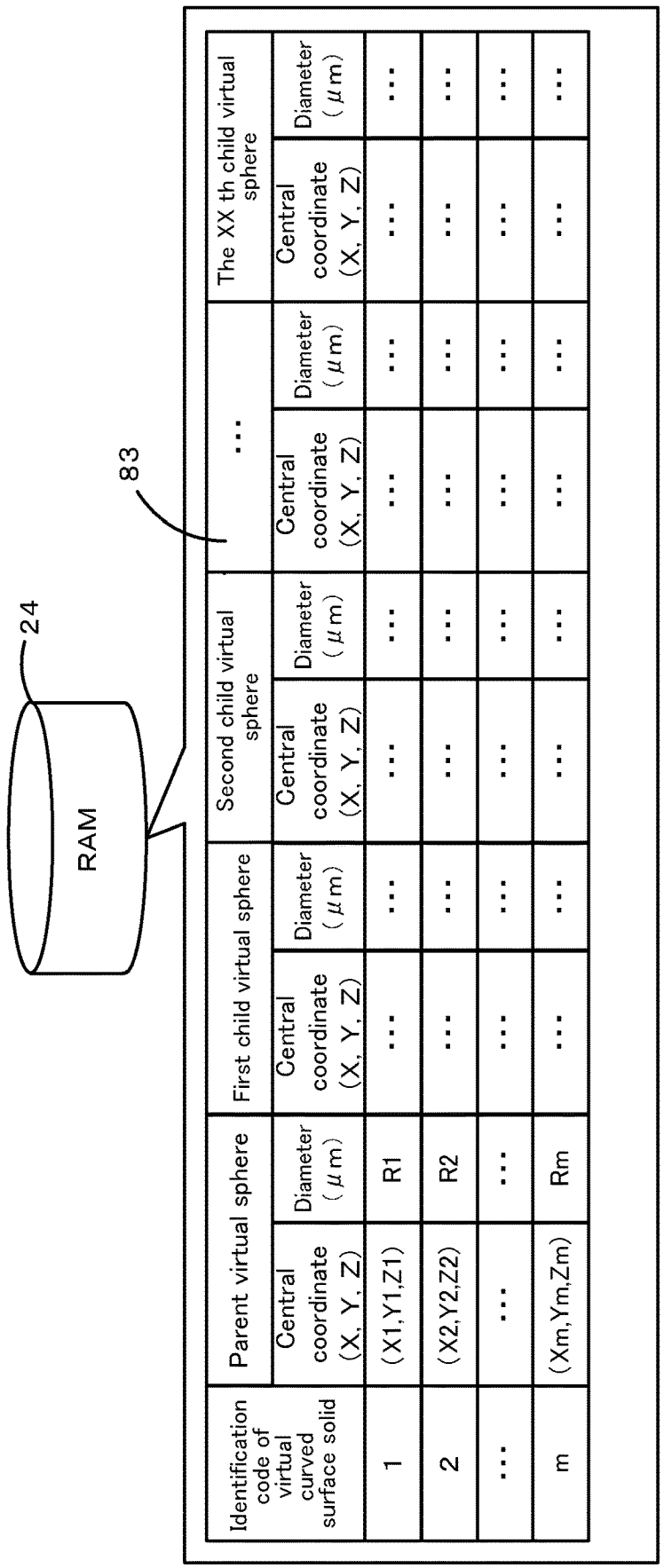
FIG. 8 is an explanatory view illustrating an example of an virtual-curved-surface-solid table 83.

In Step S320, the virtual-curved-surface-solid table 83 serving as information regarding virtual curved surface solids is stored as a part of the porous-body data 80 in the RAM 24. The virtual-curved-surface-solid table 83 includes association among the identification code of each virtual curved surface solid, the central coordinates (X, Y, Z) and diameter of the parent virtual sphere of the virtual curved surface solid, and the central coordinates and diameter of at least one child virtual sphere of the virtual curved surface solid. FIG. 8 describes an example of the virtual-curved-surface-solid table 83. As described in this drawing, the virtual-curved-surface-solid table 83 includes, regarding each of a plurality of virtual curved surface solids that have been placed as a result of repeating of Steps S230 to S320, association among the identification code, the central coordinates and diameter of the parent virtual sphere, and the central coordinates and diameter of at least one child virtual sphere of the virtual curved surface solid. Since some virtual curved surface solids each include a plurality of child virtual spheres, such an virtual curved surface solid is associated with information of the plurality of child virtual spheres: the child virtual spheres can be identified as the first child virtual sphere, the second child virtual sphere, . . . , in the order that these spheres are placed, for example. Note that a virtual curved surface solid that has no child virtual sphere, that is, an virtual curved surface solid made up of a parent virtual sphere alone, may be placed.

Figure 9A:
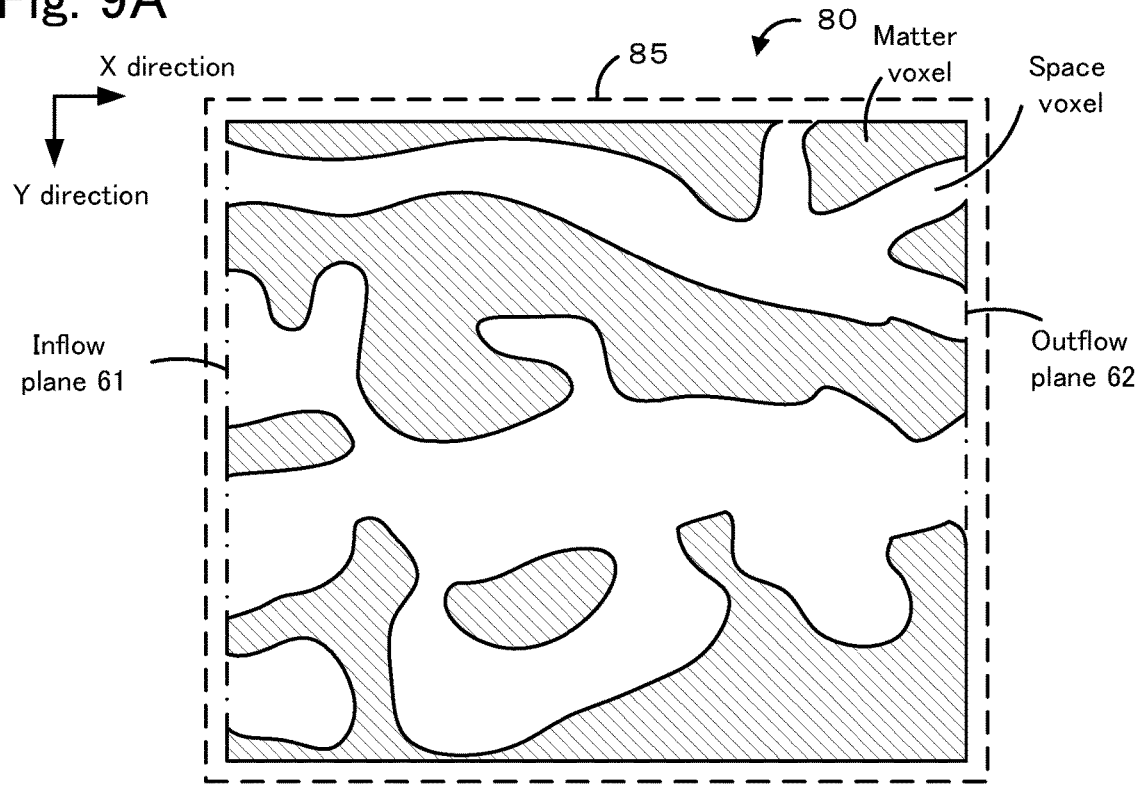
FIGS. 9A and 9B illustrate explanatory views of placement of a parent virtual sphere.
Figure 9B:
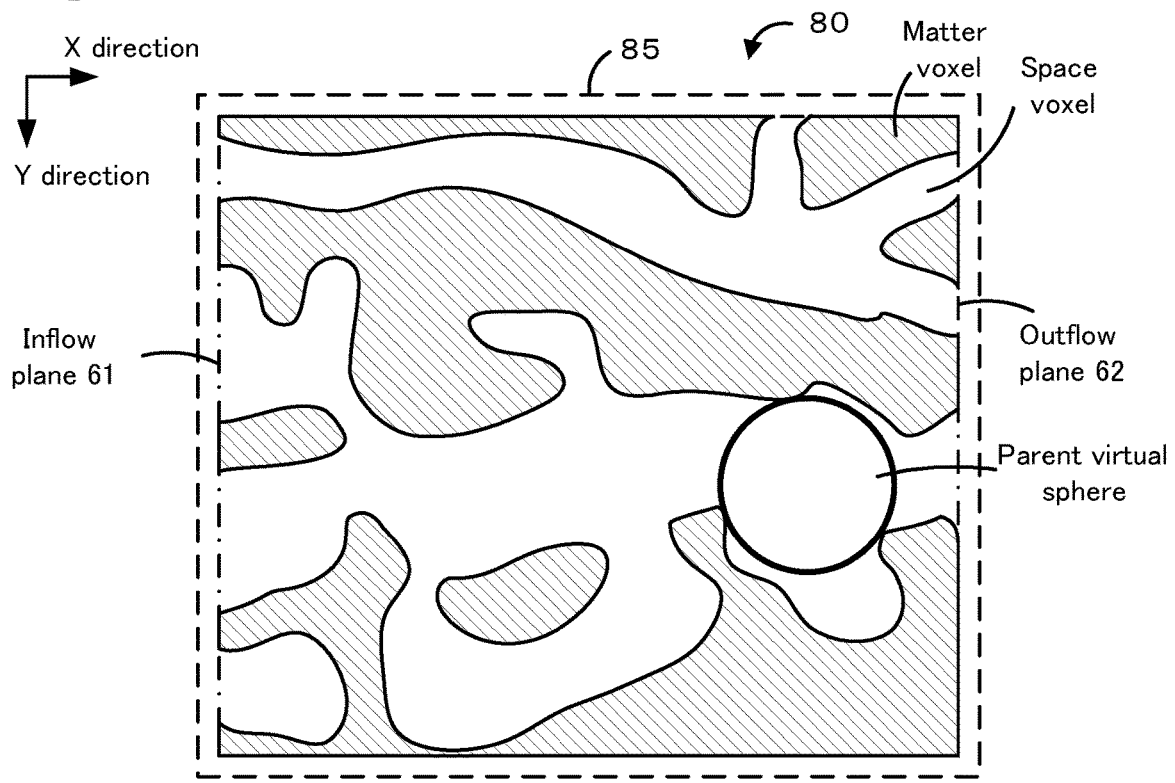
Figure 10A:
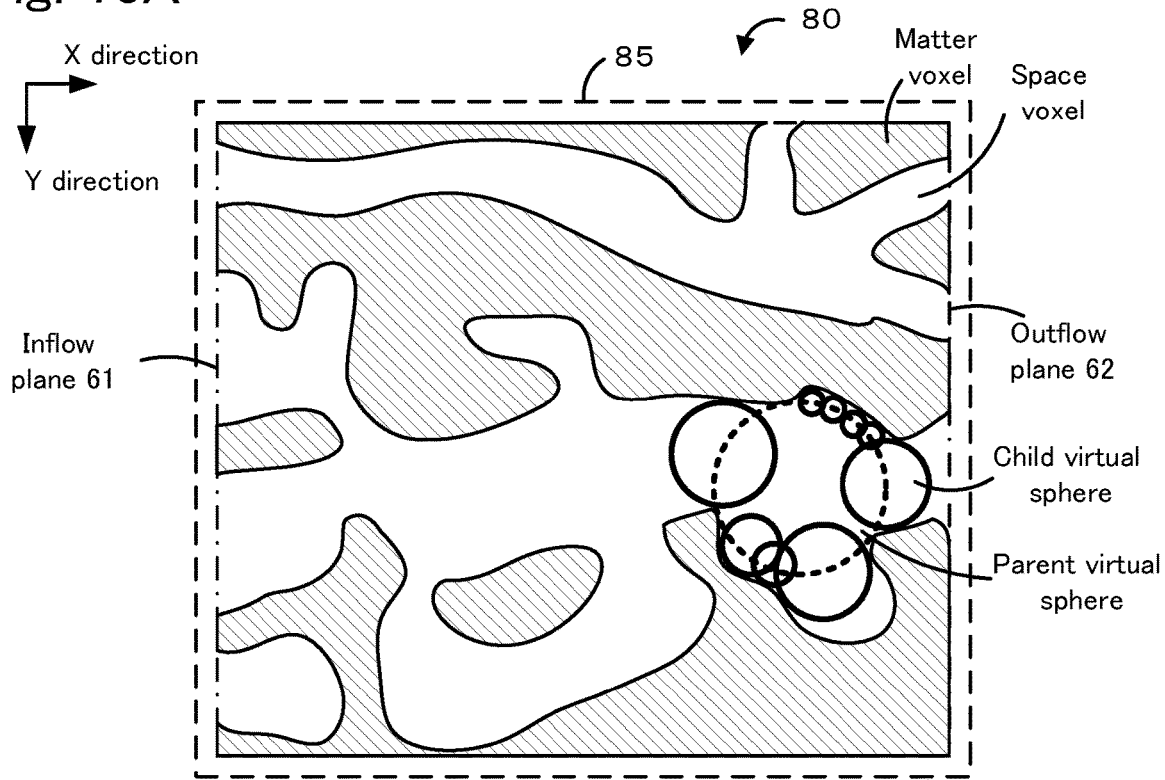
FIGS. 10A and 10B illustrates explanatory views of placement of child virtual spheres and a virtual curved surface solid.
Figure 10B:
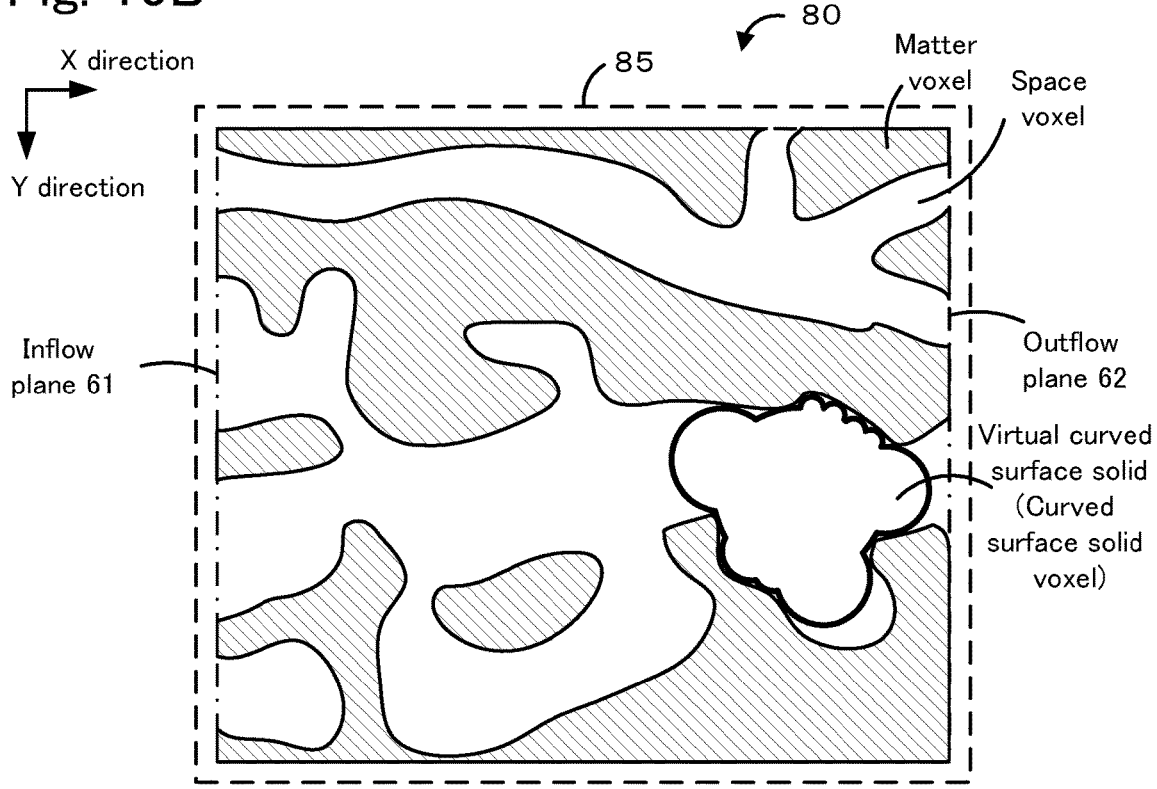

As a result of the virtual-curved-surface-solid placement process, the virtual-curved-surface-solid table 83 is stored in the RAM 24 and the placement of virtual curved surface solid results in substitution of space voxels with curved surface solid voxels. Hereinafter, the manner in which the virtual-curved-surface-solid placement process is carried out to place a single virtual curved surface solid made up of a parent virtual sphere and child virtual spheres will be described. FIGS. 9A and 9B illustrate explanatory views of placement of a parent virtual sphere. FIGS. 10A and 10B illustrate explanatory views of placement of child virtual spheres and a virtual curved surface solid. For convenience of explanation, FIGS. 9A, 9B, 10A and 10B illustrate sections parallel to the X direction in the porous-body data 80 and two-dimensionally illustrate the placement of the virtual curved surface solid. FIG. 9A is an explanatory view of an example of the porous-body data 80 in which Step S210 has just been carried out and a virtual curved surface solid is to be placed. FIG. 9B is an explanatory view in which a single parent virtual sphere is placed. FIG. 10A is an explanatory view in which a plurality of child virtual spheres are placed for the parent virtual sphere that has been placed in FIG. 9B. FIG. 10B is an explanatory view in which a virtual curved surface solid made up of the parent virtual sphere and child virtual spheres is placed. As illustrated in FIG. 9A, the porous-body data 80 is made up of matter voxels and space voxels; and, the inflow plane 61, the outflow plane 62, and the virtual wall surfaces 85 are defined. The virtual curved surface solid (parent virtual sphere and child virtual spheres) is placed so as not to extend beyond the virtual wall surfaces 85. In this state, the processes of Steps S220 to S250 are carried out: in a case where the diameter Ramax is set to a sufficiently large value, the diameter Ra is decremented by 1 in a stepwise manner; and when the diameter Ra is decremented to be equal to the maximum diameter of a parent virtual sphere that can be placed in the porous-body data 80 so as not to overlap the matter voxel and so as not to extend beyond the virtual wall surfaces 85, this single parent virtual sphere is placed (FIG. 9B). Subsequently, Steps S270 to S300 are repeated until Step S300 determines that the diameter Rb becomes less than the minimum value Rbmin. As a result, a plurality of child virtual spheres having various diameters are placed such that the centers of the child virtual spheres overlap the parent virtual sphere, and the voxels occupied by the child virtual spheres do not overlap the matter voxel and fill space voxels (FIG. 10A). After Step S300 determines that the diameter Rb is less than the minimum value Rbmin, a single virtual curved surface solid made up of the parent virtual sphere and the child virtual spheres that have been placed is placed (FIG. 10B). In this way, processes of Steps S230 to S320 in which a single virtual curved surface solid is placed are repeated until Step S330 determines that 99% or more of space voxels have been substituted with the curved surface solid voxels. Thus, virtual curved surface solids are placed one after another in other space voxels in which virtual curved surface solids have not been placed yet, to thereby fill space voxels with curved surface solid voxels. As a result, spaces (pores) having complex shapes in a porous body are substituted with virtual curved surface solids each made up of a combination of a plurality of spheres, so that the spaces within the porous body can be simulated with higher accuracy as a combination of a plurality of virtual curved surface solids.

Hereinafter, the description of the analysis processing routine in FIG. 6 will be resumed. After the virtual-curved-surface-solid placement process of Step S100 is finished, the CPU 22 carries out a fluid analysis process (Step S110) in which fluid analysis is carried out on the basis of the porous-body data 80 stored in the RAM 24 to thereby obtain information regarding flow rates in individual space voxels during passing of a fluid through the porous body. This fluid analysis process is carried out by the well-known lattice Boltzmann method. Specifically, the fluid analysis is carried out by the lattice Boltzmann method in the following manner: the central points of voxels of the porous-body data 80 are defined as lattice points; a predetermined relational expression regarding flows of a fluid entering through the inflow plane 61 and flowing between each lattice point and its adjacent lattice point is used. As information regarding the flow rates in individual space voxels, flow-rate vectors each made up of flow rate and flow direction in individual space voxels of the porous-body data 80 are obtained. The flow-rate vectors in individual space voxels are associated with the porous-body table 81 of the porous-body data 80 in the RAM 24 and stored. Note that this fluid analysis is carried out with numerical values that are necessary for the analysis and are defined in advance in, for example, the HDD 25 or the like, such as a fluid average flow rate $T_{in}$ at the inflow plane 61, a fluid viscosity $\mu$, and a fluid density $\rho$. These numerical values may be set by the user via the input devices 27. The average flow rate $T_{in}$ is the average flow rate of the fluid immediately before entry into the porous body and corresponds to the initial value of the flow rate in the fluid analysis. In this embodiment, the average flow rate $T_{in}$ is set to 0.01 m/s. The fluid is assumed to be the air at 0° C. and at 1 atm having a viscosity $\mu$ of $1.73 \times 10^{-5}$ [Pa·s] and a density $\rho$ of 1.25 [kg/m$^3$]. Note that the fluid analysis process in Step S110 is carried out such that the virtual curved surface solids that have been placed in Step S100 are not considered and the curved surface solid voxels are also assumed to be space voxels. In this embodiment, the fluid analysis process in Step S110 is carried out on the basis of the porous-body data 80 stored in the RAM 24. Alternatively, the fluid analysis process in Step S110 may be carried out on the basis of the porous-body data 60 stored in the HDD 25.

Subsequently, the CPU 22 carries out a flow-rate-weighted mean diameter evaluation process (Step S120) of obtaining the flow-rate-weighted mean diameter Ru and determining the quality of the porous body on the basis of this obtained value to thereby evaluate the trapping capability of the porous body. This process is carried out with information regarding the plurality of virtual curved surface solids that have been placed in Step S100 and information regarding the flow rates that have been obtained by the fluid analysis in Step S110. The flow-rate-weighted mean diameter Ru is obtained by an expression (1) below.

[Math. 1]

$$Ru = \frac{\sum_{i=1}^{n}(R'_i \times V_i \times U_i)}{\sum_{i=1}^{n}(V_i \times U_i)} \quad (1)$$

where

Ru: flow-rate-weighted mean diameter [μm]

n: number of virtual curved surface solids that have been placed [number]

$R'_i$: equivalent diameter of each virtual curved surface solid [μm] (i=1, 2, . . . , n)

$V_i$: volume of each virtual curved surface solid [cc] (i=1, 2, . . . , n)

$U_i$: average flow rate of fluid passing through each virtual curved surface solid [mm/s] (i=1, 2, . . . , n).

In this expression, the number n of the virtual curved surface solids that have been placed is equal to the total number of virtual curved surface solids that have been placed in the virtual-curved-surface-solid placement process of Step S100. The equivalent diameter $R'_i$, volume $V_i$, and average flow rate $U_i$ of each virtual curved surface solid are obtained in the following manner, for example. A single virtual curved surface solid is selected and curved surface solid voxels corresponding to the identification code of the selected virtual curved surface solid are examined with reference to the porous-body table 81 in the RAM 24. The number of voxels of curved surface solid voxels of the selected virtual curved surface solid is obtained; and the product of the number of voxels and the volume of a single curved surface solid voxel (in this embodiment, 1.728 μm³) is defined as the volume $V_i$. In addition, on the basis of information (the central coordinates and diameters of the parent virtual sphere and child virtual spheres) contained in the virtual-curved-surface-solid table 83, the surface area $S_i$ of the selected virtual curved surface solid is obtained. The equivalent diameter $R'_i$ is obtained by equivalent diameter $R'_i$=6×(volume $V_i$ of virtual curved surface solid)/(surface area $S_i$ of virtual curved surface solid). In addition, the quantity $Q_i$ of the fluid passing through the selected virtual curved surface solid per unit time is obtained; and the average flow rate $U_i$ is obtained by average flow rate $U_i=Q_i/\{\pi(R'_i)^2/4\}$.

In this embodiment, the voxels occupied by different virtual curved surface solids are allowed to overlap. For this reason, the volume $V_i$ used in the expression (1) is a value modified such that voxels each occupied by a plurality of virtual curved surface solids (that is, curved surface solid voxels each serving as components of a plurality of virtual curved surface solids) are each assumed to be occupied only by any one of the virtual curved surface solids. Specifically, the volume $V_i$ is modified by assuming that curved surface solid voxels each serving as components of a plurality of virtual curved surface solids are each a component that belongs only to a single virtual curved surface solid having the largest equivalent diameter $R'_i$ among the plurality of virtual curved surface solids; and the modified value is used in the expression (1). This is carried out in the following manner, for example. Without consideration as to whether or not the curved surface solid voxels each serve as components of plurality of virtual curved surface solids (that is, the curved surface solid voxels are each assumed to serve as components of any corresponding virtual curved surface solids), the volume $V_i$ is obtained. Thus, the volume $V_i$ before modification is obtained. On the basis of the volume $V_i$ before modification, the equivalent diameter $R'_i$ is obtained. The volume $V_i$ of virtual curved surface solids is obtained again in descending order of the equivalent diameter $R'_i$. At this time, curved surface solid voxels that have been used once for obtaining volume $V_i$ are no longer used for calculation of the volume $V_i$ of other virtual curved surface solids (these curved surface solid voxels are no longer counted for obtaining the number of voxels of the curved surface solid voxels of the virtual curved surface solids). As a result, the volume $V_i$ (modified volume $V_i$) can be obtained such that the curved surface solid voxels each serving as components of a plurality of virtual curved surface solids are each assumed to be a component that belongs only to the virtual curved surface solid having the largest equivalent diameter $R'_i$. This modified volume $V_i$ is used as the volume $V_i$ in the expression (1). Note that the equivalent diameter $R'_i$ used is a value based on the volume $V_i$ before modification; and the modified volume $V_i$ is not used to obtain again the equivalent diameter $R'_i$.

The quantity $Q_i$ of the passing fluid is obtained in the following manner, for example. Among curved surface solid voxels of the selected virtual curved surface solid, the curved surface solid voxels forming the surface of the virtual curved surface solid are identified on the basis of information contained in the virtual-curved-surface-solid table 83. The curved surface solid voxels forming the surface of the virtual curved surface solid can also be identified by, for example, identifying, among curved surface solid voxels of the selected virtual curved surface solid, curved surface solid voxels adjacent to any one of space voxels, matter voxels, and curved surface solid voxels of the other virtual curved surface solids. Alternatively, the curved surface solid voxels forming the surface of the virtual curved surface solid may be identified on the basis of the central coordinates and diameters of the parent virtual sphere and child virtual spheres contained in the virtual-curved surface solid table 83. Subsequently, flow-rate vectors associated with curved surface solid voxels forming the surface are examined with the porous-body table 81 in the RAM 24 to identify curved surface solid voxels having flow-rate vectors pointing directions toward inside the virtual curved surface solid; and the magnitude of the flow-rate vectors of the identified curved surface solid voxels is obtained for each curved surface solid voxel. The quantity $Q_i$ of the passing fluid is obtained as quantity $Q_i$ of the fluid passing per unit time=(sum of magnitude of flow-rate vectors)×(number of curved surface solid voxels having flow-rate vectors pointing directions toward inside virtual curved surface solid among curved surface solid voxels forming surface of virtual curved surface solid)×(area (=1.44 µm²) of single surface of curved surface solid voxel).

As described above, the CPU 22 provides the equivalent diameter $R'_i$, volume $V_i$, and average flow rate $U_i$ of individual n virtual curved surface solids and provides the flow-rate-weighted mean diameter Ru by use of the expression (1). In cases where the flow-rate-weighted mean diameter Ru obtained is 10 µm or more and 24 µm or less, the CPU 22 evaluates that the porous body (region 50 in the porous partition 44) from which the porous-body data 60 is derived is good in terms of trapping capability; and, in the other cases, the CPU 22 evaluates that the porous body is poor in terms of trapping capability. The CPU 22 stores, in the RAM 24, for example, the value of the flow-rate-weighted mean diameter Ru and the evaluation result.

Subsequently, the CPU 22 carries out a difference ΔR evaluation process (Step S130) of providing a difference ΔR that is an absolute value of the difference between an arithmetic mean diameter Rc and the flow-rate-weighted mean diameter Ru and determining the quality of the porous body on the basis of the provided value to thereby evaluate the trapping capability of the porous body. This process is carried out with information regarding the plurality of virtual curved surface solids that have been placed in Step S100 and the flow-rate-weighted mean diameter Ru that has been obtained in Step S120. The difference ΔR is obtained in the following manner. The arithmetic mean diameter $Rc=(R'_1+R'_2+ \ldots +R'_n)/n$ is obtained. The arithmetic mean diameter Rc may be obtained through the calculation of equivalent diameter $R'_i$ as in Step S120 or may be obtained with the values of equivalent diameter $R'_i$ that have been obtained in Step S120. Then, the difference ΔR is obtained by the difference ΔR=|Ru−Rc|. In cases where the CPU 22 evaluates the porous body as being good in the flow-rate-weighted mean diameter evaluation process in Step S120 and the difference ΔR obtained is 2 µm or less, the CPU 22 evaluates that the porous body (region 50 in the porous partition 44) from which the porous-body data 60 is derived is better in terms of trapping capability; and, in the other cases, the CPU 22 evaluates that the porous body is not "better". In other words, in this embodiment, in cases where the porous body is evaluated as being good in Step S120 (the flow-rate-weighted mean diameter Ru is 10 µm or more and 24 µm or less) and the porous body is evaluated as being good in Step S130 (the difference ΔR is 2 µm or less), the porous body is evaluated as being "better" in terms of trapping capability. In cases where the evaluation result is good in Step S120 but the evaluation result is not good in Step S130, the porous body is evaluated as being "good" in terms of trapping capability. In cases where the evaluation result is poor in Step S120, regardless of the evaluation result in Step S130, the porous body is evaluated as being "poor" in terms of trapping capability. The CPU 22 stores, in the RAM 24, the values of the arithmetic mean diameter Rc and difference ΔR and the evaluation results.

After carrying out the evaluation processes of Steps S120 to S130, the CPU 22 carries out an analysis-result output process (Step S140) of outputting analysis result data such as information stored in the RAM 24 during the processes and storing the analysis result data in the HDD 25, and finishes the routine. The analysis result data includes, for example, those stored in the RAM 24, such as the porous-body data 80 including the porous-body table 81, the inflow-outflow table 82, and the virtual-curved-surface-solid table 83; the value of the flow-rate-weighted mean diameter Ru and the evaluation result obtained in Step S120; and the values of the arithmetic mean diameter Rc and difference ΔR and the evaluation results obtained in Step S130. The analysis result data may also include values used in processes of Steps S120 to S130, such as the equivalent diameter $R'_i$, the volume $V_i$, and the average flow rate $U_i$; and values used in the fluid analysis process in Step S110, such as the average flow rate $T_{in}$, the fluid viscosity µ, and the fluid density ρ.

The porous partition 44 of this embodiment is subjected to the above-described analysis of the microstructure and, as a result of the analysis, it is found to have a flow-rate-weighted mean diameter Ru of 10 µm or more and 24 µm or less. It is more preferable that the difference ΔR is 2 µm or less.

Hereinafter, a method for producing the honeycomb filter 30 including the porous partitions 44 according to this embodiment will be described. Here, a method for producing the honeycomb filter 30 including the porous partitions 44 mainly composed of cordierite will be described as an example.

The porous partitions 44 of the honeycomb filter 30 can be produced by a raw-material mixing step of mixing a base material and a pore-forming agent, to provide green body; and a molding and firing step of molding the green body to provide a compact and firing this compact. The base material is a mixture of talc having an average particle size of 1 µm or more and 18 µm or less, alumina, and an auxiliary raw material containing a material that undergoes a eutectic reaction with talc and being prepared in an amount so as to satisfy a weight ratio of 0.5% or more and 1.5% or less by weight relative to the talc. The talc preferably has an average particle size of 5 µm or more and 12 µm or less. The weight ratio of the alumina to the talc is 30% or more and 45% or less by weight, for example. The base material may further contain silica in an amount so as to satisfy a weight ratio of 42% or more and 56% or less by weight relative to the talc, or magnesia in an amount so as to satisfy a weight ratio of 12% or more and 16% or less by weight relative to the talc. The auxiliary raw material is at least one selected from zirconium oxide, cerium oxide, and yttrium oxide, for example. The weight ratio of the auxiliary raw material relative to the talc is more preferably 0.5% or more and 1.0% or less by weight. The pore-forming agent is preferably burnt off by firing to be carried out: starch, coke, or porous resin, for example. The raw-material mixing step may be carried out by adding, for example, a binder such as methylcellulose or hydroxypropoxyl methylcellulose, water, and a dispersing agent. The dispersing agent may be a surfactant such as ethylene glycol. The process of preparing green body is not particularly limited and may be carried out by a method using a kneader or a vacuum clay kneader, for example. The green body is, for example, extruded through a die having a shape corresponding to the arrangement of the cells 34, so as to have the shape illustrated in FIGS. 1 and 2. In the extruded material, the cells 34 are sealed with the outlet sealing material 38 and the inlet sealing material 42. Subsequently, the extruded material is subjected to a drying treatment, a calcination treatment, and a firing treatment to thereby produce the honeycomb filter 30 including the porous partitions 44. The outlet sealing material 38 and the inlet sealing material 42 may be formed of the raw material forming the porous partitions 44. The calcination treatment is carried out at a temperature lower than the firing temperature, to burn off organic components contained in the honeycomb filter 30. The firing temperature is 1350° C. to 1440° C. and is preferably 1410° C. to 1430° C. By carrying out the above-described steps, the honeycomb filter 30 including the porous partitions 44 can be obtained.

According to the embodiment having been described in detail so far, the porous partitions 44 formed of a porous body are found to have a flow-rate-weighted mean diameter Ru of 10 μm or more and 24 μm or less as a result of the microstructure analysis using the user PC 20; and hence the porous partitions 44 have a sufficiently high trapping capability. In addition, in cases where the difference ΔR is 2 μm or less, the porous partitions 44 have a higher trapping capability.

The larger the extent of variation in the volume $V_i$ or average flow rate $U_i$ among a plurality of virtual curved surface solids that have been placed, the larger the tendency for the flow-rate-weighted mean diameter Ru to become excessively large or small. Regarding pores of a porous body that are simulated with virtual curved surface solids having a large volume $V_i$, the probability that a fluid passing through the pores comes into contact with the wall surfaces of the porous body tends to decrease. Regarding pores of a porous body that are simulated with virtual curved surface solids having a small volume $V_i$, a fluid tends not to pass through the pores or a catalyst tends not to be appropriately applied to the wall surfaces of the pores, the catalyst being used for the porous body to be used as a filter. Regarding pores of a porous body that are simulated with virtual curved surface solids having an average flow rate $U_i$ higher than the average flow rate (simple average flow rate) of the whole pores of the porous body, a fluid passes through these pores in a short time and hence these pores tend not to contribute to the trapping capability. Regarding pores of a porous body that are simulated with virtual curved surface solids having an average flow rate $U_i$ lower than the average flow rate (simple average flow rate) of the whole pores of the porous body, the amount of a fluid entering these pores is small and hence these pores tend not to contribute to the trapping capability. As has been described, pores of a porous body that are simulated with virtual curved surface solids having an excessively large or small volume $V_i$ or an excessively high or low average flow rate $U_i$ tend not to contribute to the trapping capability. This is probably the reason why, in porous bodies having a large portion that tends not to contribute to the trapping capability, the flow-rate-weighted mean diameter Ru is found to be excessively large or small; and the trapping capability probably correlates with the flow-rate-weighted mean diameter Ru. In cases where the flow-rate-weighted mean diameter Ru is 10 μm or more and 24 μm or less, the flow-rate-weighted mean diameter Ru is not excessively large or small and a sufficiently high trapping capability is probably achieved. Among cases where the flow-rate-weighted mean diameter Ru is substantially the same, cases where the absolute value of the difference between the arithmetic mean diameter Rc and the flow-rate-weighted mean diameter Ru is small tend to achieve a better trapping capability of the porous body. Accordingly, a porous body that has a flow-rate-weighted mean diameter Ru of 10 μm or more and 24 μm or less and a difference ΔR of 2 μm or less tends to have a higher trapping capability.

In the production of the porous partitions 44, use of talc having an average particle size of 18 μm or less probably results in suppression of generation of excessively large pores. By adding an auxiliary raw material containing a material that undergoes a eutectic reaction with talc, excessively small pores through which a fluid tends not to pass are probably filled. In addition, the firing temperature of 1350° C. to 1440° C. probably results in a sufficiently high strength of the porous body. As a result, generation of excessively large or small pores is suppressed and generation of pores causing an excessively high or low flow rate is suppressed; and this probably results in a high trapping capability.

The present invention is not limited to the above-described embodiment. It is clear that the present invention can be implemented in a variety of embodiments without departing from the technical scope thereof.

EXAMPLES

Hereinafter, an example in which a porous body according to the present invention was actually produced will be described as an Example. Note that Experimental examples 1 to 3 are Comparative examples with respect to the present invention and Experimental example 4 is an Example of the present invention. However, the present invention is not limited to the Example described below.

Experimental Example 1

A honeycomb filter of Experimental example 1 was produced in the following manner. A talc powder A having an average particle size of 12 μm, alumina, and zirconium oxide ($ZrO_2$) serving as an auxiliary raw material were prepared and mixed together to provide a base material. The weight ratio of the zirconium oxide ($ZrO_2$) to the talc powder A was set to 1.75%. The weight ratio of the alumina to the talc powder A was set to 20%. The thus-obtained base material and a pore-forming agent (starch) having an average particle size of 30 μm were mixed together in a mass ratio of 100:30. This mixture was mixed with methylcellulose serving as an organic binder and an appropriate amount of water to thereby provide green body. Subsequently, this green body was extruded through a predetermined die to thereby provide a compact including the porous partitions 44 having the shape illustrated in FIGS. 1 and 2 (note that the exterior of the compact had a shape of a quadrangular prism). Subsequently, the compact obtained was dried with microwaves, further dried with hot gas, then subjected to sealing of cell openings, calcined in an oxidizing atmosphere at 550° C. for 3 hours, and then fired in an inert atmosphere at 1430° C. for 2 hours. The sealed portions were formed in the following manner: masks were placed on alternate cell openings at an end of the compact; and this masked end was immersed in a sealing slurry (formed of the same material as the green body), so that openings and sealed portions were arranged alternately. Similarly, the other end was also masked and sealed portions were formed such that cells having one open end and the other sealed end and cells having one sealed end and the other open end were alternately arranged. The compact having been fired was ground so as to have a cylindrical shape. Subsequently, the periphery of this cylinder was coated with a periphery coating slurry prepared by kneading alumina silicate fibers, colloidal silica, polyvinyl alcohol, SiC, and water. This slurry was cured by drying to thereby form a peripheral protective part 32. Thus, the honeycomb filter of Experimental example 1 was obtained. This honeycomb filter had a diameter of 118.4 mm in cross section, a length of 127 mm, a cell density of 360 cells/square inch, and a partition thickness of 5 mil.

Experimental Example 2

A honeycomb filter of Experimental example 2 was produced as in Experimental example 1 except that the talc powder A was replaced by a talc powder B having an average particle size of 25 μm.

Experimental Example 3

A honeycomb filter of Experimental example 3 was produced as in Experimental example 1 except that the talc powder A was replaced by a talc powder C having an average particle size of 20 μm, the weight ratio of the zirconium oxide ($ZrO_2$) to the talc powder C was set to 1%, and the firing temperature was set to 1420° C.

Experimental Example 4

A honeycomb filter of Experimental example 4 was produced as in Experimental example 1 except that the weight ratio of the zirconium oxide ($ZrO_2$) to the talc powder A was set to 1% and the firing temperature was set to 1420° C.

[Preparation of Microstructure Analyzer]

A microstructure analyzer for evaluating Experimental examples 1 to 4 was prepared. An analysis processing program having the function described in the embodiment above was created. This program was stored in the HDD of a computer including a controller including a CPU, a ROM, and a RAM, and the HDD. Thus, the microstructure analyzer was prepared.

[Analysis of Microstructure]

The porous partitions (porous body) of the honeycomb filter of Experimental example 1 were subjected to a CT scan. From the resultant voxel data, a piece of data was extracted in which the length in the X direction was 300 μm (=1.2 μm×250 voxels), which was the same as the partition thickness in the passing direction of exhaust gas, the length in the Y direction was 480 μm (=1.2 μm×400 voxels), and the length in the Z direction was 480 μm (=1.2 μm×400 voxels). This data was defined as the above-described porous-body data 60 and stored in the HDD in Experimental example 1. The above-described analysis processing routine was executed for the porous-body data 60 in Experimental example 1. This provided analysis result data including, as described above, the porous-body table, the virtual-curved surface solid table, values of the flow-rate-weighted mean diameter Ru and difference ΔR, and values of the equivalent diameter $R'_1$, volume $V_j$, and average flow rate $U_j$ of each virtual curved surface solid. Similarly, analysis result data was obtained for Experimental examples 2 to 4. As a result, the flow-rate-weighted mean diameters Ru in Experimental examples 1 to 4 were respectively 26.3 μm, 29.9 μm, 24.5 μm, and 23.7 μm. The differences ΔR in Experimental examples 1 to 4 were respectively 2.0 μm, 3.0 μm, 2.1 μm, and 2.1 μm.

[Measurement of Number of Leaked Particles]

Regarding Experimental examples 1 to 4, the number of leaked particles was measured as a value representing the actual trapping capability. Specifically, the filters of Experimental examples 1 to 4 were attached to the exhaust pipe of a car through which exhaust gas passes. The gasoline engine of the car was run on the basis of NEDC (New European Driving Cycle)-mode driving to thereby pass a fluid containing particulate matter (engine exhaust gas) through the filters. In the fluid having passed through the filters, the amount of remaining particulate matter was measured as the number of leaked particles. This number of leaked particles was converted with respect to 1 km of driving distance. Thus, the number of leaked particles [number/km] was obtained as a value representing the trapping capability.

Figure 11:
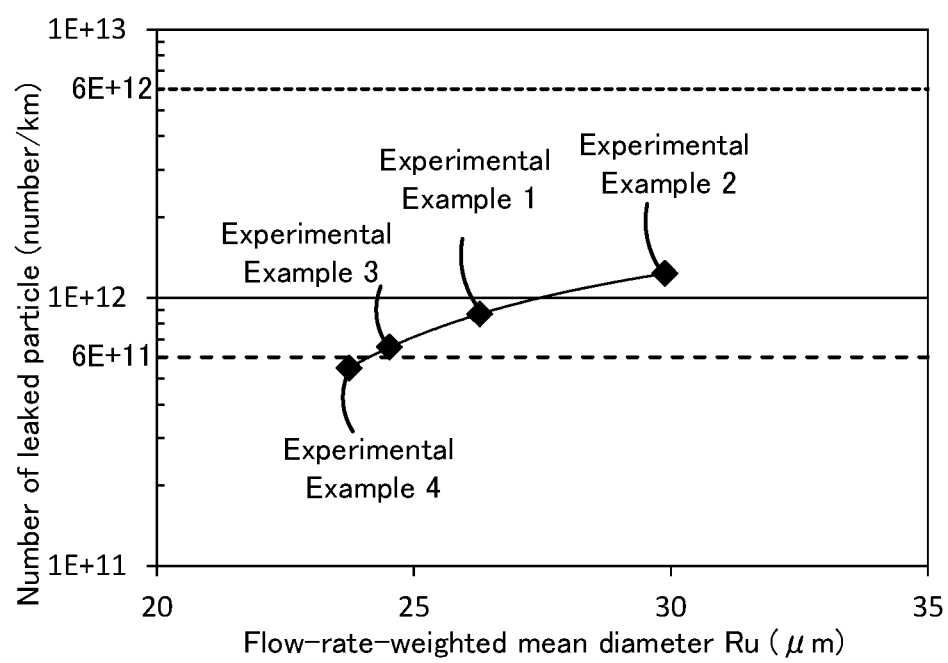
FIG. 11 is a graph illustrating the relationship between flow-rate-weighted mean diameter Ru and the number of leaked particles in Experimental examples 1 to 4.

Table 1 summarizes the average particle size of talc powders, the weight ratio of the auxiliary raw material (zirconium oxide) to talc, the firing temperature, the flow-rate-weighted mean diameter Ru, the difference ΔR, and the number of leaked particles in Experimental examples 1 to 4. FIG. 11 is a graph illustrating the relationship between the flow-rate-weighted mean diameter Ru and the number of leaked particles in Experimental examples 1 to 4.

TABLE 1

|   | Particle size of talc powder [μm] | Weight ratio of auxiliary raw material to talc (% by weight) | Firing temperature [° C.] | Flow-rate-weighted mean diameter Ru [μm] | Difference ΔR [μm] | Number of leaked particles [Number/s] |
|---|---|---|---|---|---|---|
| Experimental Example 1 | 12 | 1.75% | 1430° C. | 26.3 | 2.0 | 8.67E+11 |
| Experimental Example 2 | 25 | 1.75% | 1430° C. | 29.9 | 3.0 | 1.23E+12 |
| Experimental Example 3 | 20 | 1% | 1410° C. | 24.5 | 2.1 | 6.54E+11 |
| Experimental Example 4 | 12 | 1% | 1410° C. | 23.7 | 2.1 | 5.45E+11 |

Table 1 and FIG. 11 indicate the following. Comparison among Experimental examples 1 to 4 indicates that the smaller the flow-rate-weighted mean diameter Ru, the smaller the number of leaked particles (the higher the trapping capability). In Experimental example 4 in which the flow-rate-weighted mean diameter Ru is 24 μm or less, the number of leaked particles was smaller than that in Experimental examples 1 to 3. In Experimental example 4, the condition that the number of leaked particles is $6\times10^{11}$ or less [particles/km], which is the limit for exhaust gas emitted from automobiles (Euro 6 (2017 and after)), was satisfied. Thus, the trapping capability was sufficiently high. Note that FIG. 11 illustrates both the limit of Euro 6 (2017 and after) (number of leaked particles: $6\times10^{11}$ [particles/km]) and the limit of Euro 6 (before 2017) (number of leaked particles: $6\times10^{12}$ [particles/km]) (broken lines in FIG. 11).

The present application claims priority of Japanese Patent Application No. 2014-072362 filed on Mar. 31, 2014, the entire contents of which are incorporated herein by reference.

What is claimed is:

1. A method for producing a porous body, comprising:
a raw-material mixing step of mixing talc having an average particle size of 1 μm or more and 18 μm or less, alumina, an auxiliary raw material containing a material that undergoes a eutectic reaction with talc and being prepared in an amount so as to satisfy a weight ratio of 0.5% or more and 1.0% or less by weight relative to the talc, and a pore-forming agent, to provide green body; and a molding and firing step of molding the green body to provide a compact and firing this compact at a firing temperature of 1350° C. to 1440° C. ; and wherein the auxiliary raw material is at least one selected from zirconium oxide, cerium oxide, and yttrium oxide.

2. The method for producing a porous body according to claim 1, wherein the talc has an average particle size of 5 μm or more and 12 μm or less.

3. The method for producing a porous body according to claim 1, wherein the firing temperature is 1410° C. to 1430° C.

* * * * *